(12) United States Patent
Käppeler et al.

(10) Patent No.: US 8,986,453 B2
(45) Date of Patent: Mar. 24, 2015

(54) DEVICE FOR COATING SUBSTRATES DISPOSED ON A SUSCEPTOR

(75) Inventors: Johannes Käppeler, Würselen (DE); Adam Boyd, Kelmis (BE); Victor Saywell, Bury St. Edmunds (GB); Jan Mulder, Eindhoven (NL); Olivier Feron, Hsinchu (TW)

(73) Assignee: Aixtron Inc., Sunnyvale, CA (US)

( * ) Notice: Subject to any disclaimer, the term of this patent is extended or adjusted under 35 U.S.C. 154(b) by 960 days.

(21) Appl. No.: 12/664,648

(22) PCT Filed: Jun. 13, 2008

(86) PCT No.: PCT/EP2008/057452
§ 371 (c)(1),
(2), (4) Date: Dec. 14, 2009

(87) PCT Pub. No.: WO2008/152126
PCT Pub. Date: Dec. 18, 2008

(65) Prior Publication Data
US 2010/0186666 A1  Jul. 29, 2010

(30) Foreign Application Priority Data
Jun. 15, 2007 (DE) .......................... 10 2007 027 704

(51) Int. Cl.
*B05C 11/00* (2006.01)
*C23C 16/458* (2006.01)
(Continued)

(52) U.S. Cl.
CPC ......... *C23C 16/4586* (2013.01); *C23C 16/4583* (2013.01); *C23C 16/46* (2013.01); *C30B 25/12* (2013.01); *H01L 21/68735* (2013.01)
USPC ....... 118/725; 118/724; 118/641; 156/345.51

(58) Field of Classification Search
USPC ...................... 118/641, 724, 725; 156/345.51
See application file for complete search history.

(56) References Cited

U.S. PATENT DOCUMENTS 5,091,208 A   2/1992   Pryor
5,480,489 A   1/1996   Hasegawa
(Continued)

FOREIGN PATENT DOCUMENTS

DE   10 2005 056536 A1   5/2007
DE   10200608515         10/2007
(Continued)

OTHER PUBLICATIONS

Aixtron AG; PCT/EP2008/057452 Filed Jun. 13, 2008; International Search Report and Written Opinion; ISA/EP; Jan. 1, 2009; 11 pp.
(Continued)

*Primary Examiner* — Sylvia R MacArthur
(74) *Attorney, Agent, or Firm* — Ascenda Law Group, PC (57) ABSTRACT

The invention relates to a device for coating substrates having a process chamber (1) disposed in a reactor housing and a two-part, substantially cup-shaped susceptor (2, 3) disposed therein, forming an upper susceptor part (2) with the cup floor thereof having a flat plate (2') and a lower susceptor part (3) with the cup side walls thereof, the outer side (4) of the plate (2') of the upper susceptor part (2) facing upwards toward the process chamber (1) and forming a contact surface for at least one substrate, the upper susceptor part (2) contacting a front edge (3") of the lower susceptor part (3) at the edge of said upper susceptor part (2), the lower susceptor part (3) being supported by a susceptor carrier (6), and heating zones (A, B, C) for heating the upper susceptor part (2) being disposed below the plate (2'). An advantageous refinement of the invention proposes that the upper susceptor part (2) be removable from the process chamber (1) separately from the lower susceptor part (3), and the joint (30) between the edge of the upper susceptor part (2) and the front edge (3") of the lower susceptor part (3) be formed as a heat conduction barrier.

15 Claims, 5 Drawing Sheets

(51) Int. Cl.
  *C23C 16/46* (2006.01)
  *C30B 25/12* (2006.01)
  *H01L 21/687* (2006.01)

(56) References Cited

U.S. PATENT DOCUMENTS

| | | |
|---|---|---|
| 5,552,124 A | 9/1996 | Su |
| 5,591,269 A | 1/1997 | Arami et al. |
| 2004/0226515 A1 | 11/2004 | Yendler et al. |
| 2006/0057826 A1 | 3/2006 | De Boer |
| 2008/0261800 A1* | 10/2008 | Yuan et al. .................... 501/152 |
| 2010/0186666 A1* | 7/2010 | Kappeler et al. ............. 118/641 |

FOREIGN PATENT DOCUMENTS

| | | |
|---|---|---|
| JP | 06020969 | 1/1994 |
| WO | 02/097867 A | 12/2002 |
| WO | 2004/079043 | 9/2004 |

OTHER PUBLICATIONS

IPER from PCT/EP2008/057452 dated Jan. 12, 2012 (English Translation), 8 pages.

Aixtron, SE; Communication from European Application No. 2165006; dated Sep. 9, 2013 (28 pages).

Aixtron, SE; European Application No. 2165006; Decision to grant a EP Patent; dated Feb. 13, 2014 (2 pages).

* cited by examiner

DEVICE FOR COATING SUBSTRATES DISPOSED ON A SUSCEPTOR

CROSS REFERENCES TO RELATED APPLICATIONS

The present patent application is a National Stage under 35 USC 365 and claims priority to PCT International Application No. PCT/EP2008/057452 filed Jun. 13, 2008, incorporated herein by reference, which claims priority benefit from DE Application No.: 102007027704.2 filed Jun. 15, 2007.

The invention relates to a device for coating substrates, having a process chamber which is disposed in a reactor housing and having a two-part, substantially cup-like susceptor which is disposed in said process chamber, the susceptor forming a susceptor upper part by way of its cup base, the cup base having a flat plate, and the susceptor forming a susceptor lower part by way of its cup side wall, the outer side of the plate of the susceptor upper part facing upward toward the process chamber and forming a bearing surface for at least one substrate, the susceptor upper part, by way of its edge, resting on an end edge of the susceptor lower part, the susceptor lower part being supported by a susceptor carrier, and heating zones for heating the susceptor upper part being disposed beneath the plate.

A device of this generic type is described by US2004/0226515 A1. A susceptor in the form of a cup which is upside down is located in a process chamber. The base plate of the cup forms the bearing surface for the substrates. A heater is located beneath the base surface.

DE 102005056536 A1 discloses a device in which the susceptor comprises a single graphite part. It has the shape of a cup, with the outwardly facing wall of the cup base forming a bearing surface for substrates. This cup outer side forms the base of a process chamber, and the cover of said process chamber is formed by a gas inlet element. A heater is located within the cup opening of the susceptor, in order to heat the surface of the susceptor to a process temperature which can be 1600° C. DE 102006018515 A1 discloses a reactor housing with a process chamber disposed therein, the annular susceptor resting on an annular collar in said process chamber.

WO2004/079043 A2 discloses a susceptor for a coating installation, which susceptor comprises a plurality of parts that have a high thermal conductivity.

U.S. Pat. No. 5,480,489 discloses a CVD reactor having a multipart susceptor for holding substrates. The contact portion for the substrate of the susceptor comprises graphite.

US 2006/0057826 A1 describes a susceptor having a cut-out in the rear region, into which a thermocouple projects.

U.S. Pat. No. 5,091,208 shows a multipart susceptor in a CVD reactor, with the susceptor having a central opening into which a temperature sensor projects.

U.S. Pat. No. 5,552,124 likewise describes a multipart susceptor having an opening into which a pin can project.

JP 06020969 A discloses a cylindrical susceptor which comprises graphite.

U.S. Pat. No. 5,591,269 discloses a device in which a susceptor has, on its lower side, a cylindrical projection with an end face opening. A thermocouple is situated in the end face opening.

WO02/097867 describes a device comprising a carrier body and a substrate holder which is mounted on said carrier body and is driven in rotation. The carrier body and substrate holder are in the form of rings.

In prior art CVD installations, the diameter of the substantially circular bearing surface for the substrates can be larger than 300 mm. The heater used may be an induction coil or a resistance wire. A plurality of heating zones in different radial portions are possible. The susceptor is disposed, with its cup opening downward, in the reactor housing in such a way that it can be supported on a susceptor carrier by a support flank which is associated with the side wall of the cup-like body. The susceptor carrier can be formed by a quartz tube. The latter may be driven in rotation, so that the bearing surface for the substrates can rotate relative to the gas inlet element. A large number of substrates are situated on the bearing surface at different radial distances from the center. The problem in terms of the method is that of bringing the bearing surface for the substrates to the desired deposition temperature in the edge region also, with the lateral temperature gradient on the bearing surface being very low, as far as possible right into the edge region.

The substrates which rest on the susceptor are coated by means of gases introduced into the process chamber through the gas inlet element. These gases decompose either in the gas phase or upon contact with the substrate surface, in order to condense on the substrate surface, in particular so as to form a crystalline layer. For the deposition of a homogeneous layer, not only a homogeneous temperature profile of the susceptor is required. Initial conditions which are in other respects identical from run to run are also required. In order to achieve this, the susceptor is removed from the process chamber from time to time in order to be cleaned outside the reactor housing.

It is an object of the invention to develop a device of this generic type such that it is advantageous for use.

The object is achieved by the invention specified in the claims, with Claims 2 to 11 relating to advantageous developments of Claim 1, and Claims 13 to 15 relating to advantageous developments of Claim 12. In principle, any claim can represent an independent solution to the problem and can be combined with any other claim.

First and foremost, provision is made for the susceptor to comprise two parts which can be separated from one another and are composed of the same material. A lower, annular part of the susceptor forms the support flank by way of which the susceptor is supported on the susceptor carrier. This lower part of the susceptor preferably also forms the major part of the side surface of the whole cup-like body. The upper part of the susceptor forms at least the entire cup base, that is to say the entire bearing surface for the substrates. It is also essential that the joint 30 between the edge of the susceptor upper part and the end edge of the susceptor lower part is in the form of a barrier against the conduction of heat. This has the result that the heat which is supplied to the susceptor upper part by the heater does not flow away, or flows away only to a minor extent, into the lower susceptor part by thermal conduction. In one development of the invention, provision is made for the upper side of the susceptor, which forms the base of the process chamber, to merge with the side wall so as to form a rounded portion. The rounded portion and a portion of the side wall can in this case be associated with the upper part of the susceptor. The rounded portion has a radius which can be 15 mm. The radius is preferably in a range of between 10 mm and 20 mm. The inner wall of the cup likewise has a rounded portion in the transition region between the cup base and the cup side wall. The radius of curvature of this inner rounded portion is less than the radius of the outer rounded portion and can be 10 mm. In this case too, the radius can lie in a certain range of values of from 5 mm to, for example, 15 mm. A plurality of heated zones are located beneath the base plate which is formed by the susceptor upper part. The zones are substantially rotationally symmetrical and are at different distances from the center of the susceptor. The heaters can be formed by resistance wires. These are then disposed in a helical manner. In the edge region, that is to say in the vicinity of the inner rounded portion, the individual turns of the resistance heater are closer together than in the region beneath the central region of the susceptor. In one variant of the invention, the susceptor upper part does not have a side wall portion but lies on the end edge flank of a tubular lower susceptor part, so as to form a flat cover in the form of a circular disc. In the region of the seating zone, that is to say in the edge region, the susceptor upper part has a sloping, annular edge surface which, like the rounded portion of the first variant, results in a reduction in the lateral temperature gradient on the outer side of the susceptor which faces the gas inlet element. On account of the sloping edge surface, the material thickness of the susceptor plate is somewhat reduced in the edge region. The broad-side wall of the susceptor upper part which is opposite from the sloping edge surface can form an annular step by way of which the susceptor upper part is supported on the susceptor lower part in a positive manner. A small step can likewise be provided in the first variant in order to form a positive connection between the two susceptor parts. However, as an alternative to this, protrusions can also be provided, these protrusions being associated, for example, with the susceptor lower part and engaging in corresponding pockets which are associated, for example, with the susceptor upper part. The susceptor is driven in rotation. Driving is preferably effected by means of the susceptor carrier in such a way that the susceptor rotates with respect to the zone heaters. As a result, inhomogeneities are averaged out over time.

By means of the abovementioned design features, it is possible to keep the differential temperature range of a susceptor plate, which is heated to 1600° C. and has a diameter of up to 400 mm, to below 80° C. Even a differential temperature range as low as less than 60° C. can be achieved with the susceptor upper part which has rounded edges. The production of a susceptor of this type is also simplified by means of the design features. Said susceptor can be produced from two parts, with one part forming the bearing surface for the substrates and another part forming an annular surrounding region. Furthermore, the configuration according to the invention simplifies cleaning of the susceptor. Since the base can be separated from the cup wall, it is only necessary to separate the cup base from the cup wall within the reactor for cleaning purposes. Only the cup base then needs to be removed from the reactor for cleaning purposes. The rounded portion provided at the edge brings uniformity to the temperature profile of the susceptor surface.

If there is a small gap between the support flank of the upper susceptor part and the end edge of the lower susceptor part, a sudden jump in temperature is established here. This has the effect that the edge region of the upper susceptor part experiences a lesser degree of cooling due to thermal conduction. The gap need measure only 100 μm.

A further development of or solution to the problem, which development or solution is also of independent character, is that of developing, for a device for coating substrates that has a susceptor which is disposed in a reactor housing, an accommodating opening for a thermocouple, the opening being located on the surface of the lower side of the susceptor. In this respect, the invention proposes that the accommodating opening is a recess. This recess is defined by an annular bead which projects from the surface of the lower side of the susceptor. The base of the recess is situated substantially in the same plane in which the surface of the lower side that surrounds the annular bead is also located. As a result, the material thickness of the susceptor base plate in the region of the thermocouple is also exactly the same as in the surrounding region. The thermocouple is situated in front of the head of a thermocouple holder which extends into the recess. The annular bead not only forms a radiation screen. It also prevents corruption of measurements due to convecting gases. The thermocouple is preferably in physical contact with the base of the recess. However, the thermocouple may also be a short distance away from the base of the recess.

Exemplary embodiments of the invention will be explained in greater detail below with reference to attached drawings, in which.

Figure 1:
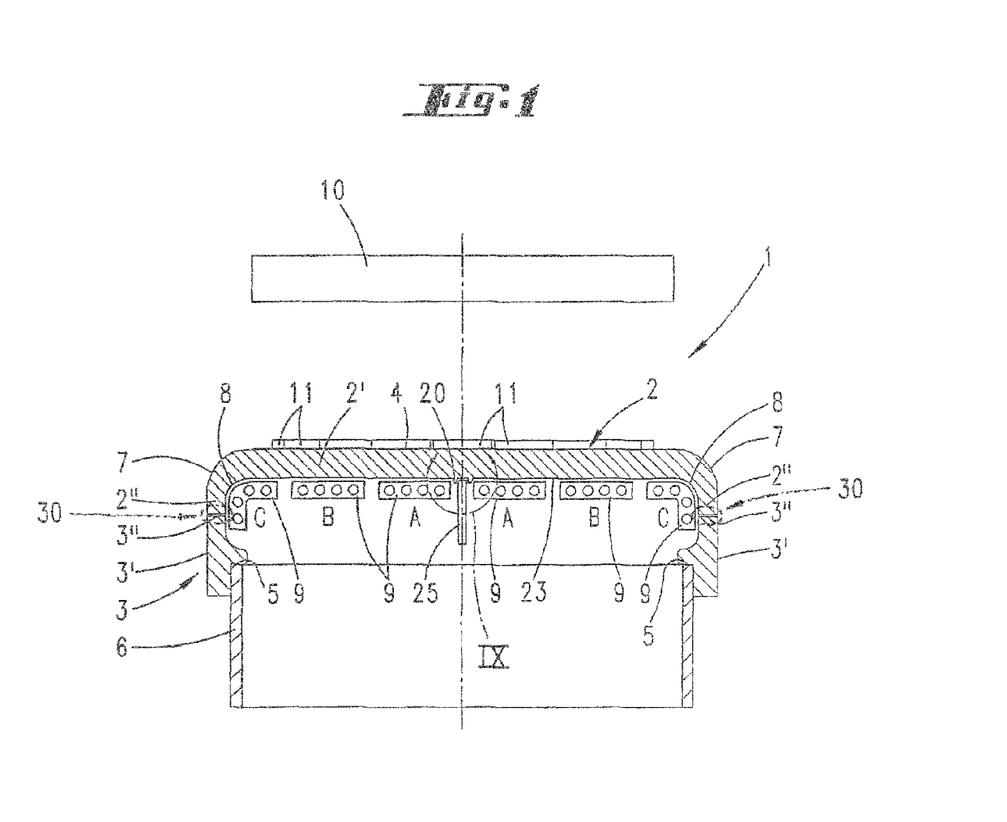
FIG. 1 shows a cross-section through the significant units which define the process chamber in a reactor housing, of a first exemplary embodiment.
Figure 2:
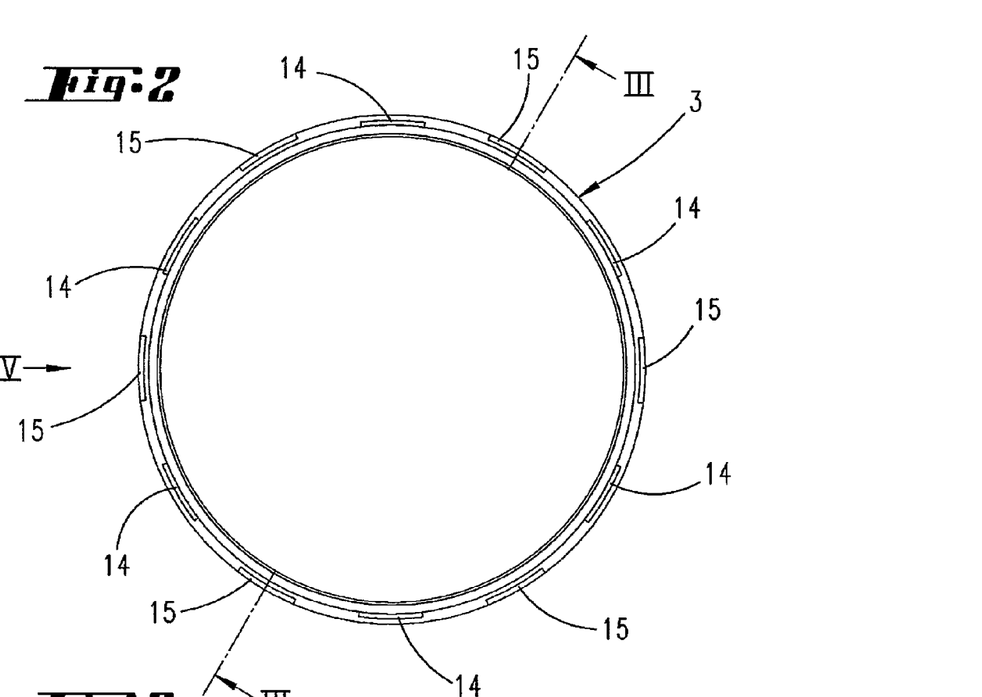
FIG. 2 shows a plan view of a susceptor lower part.
Figure 8:
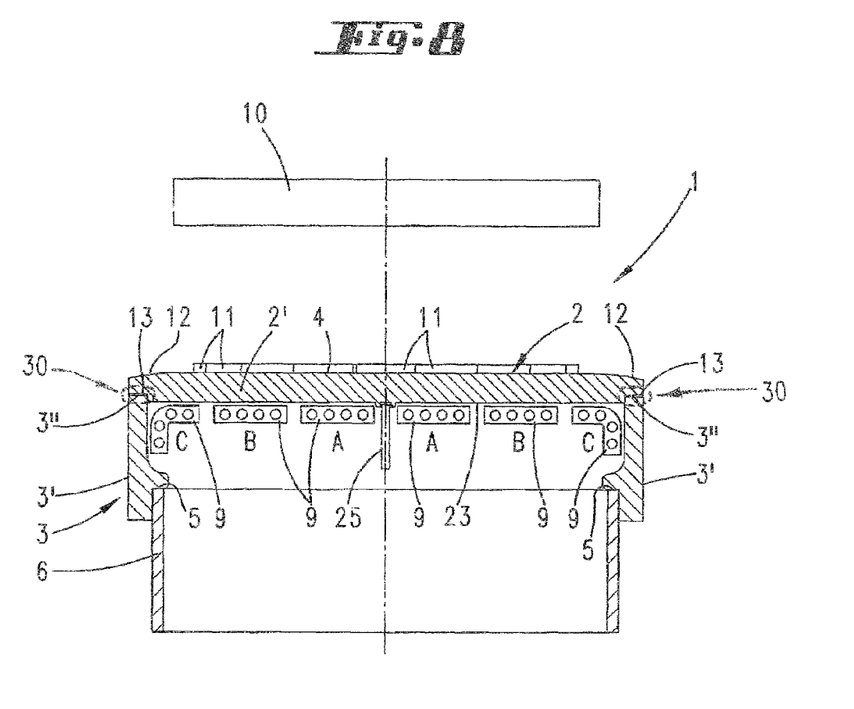
FIG. 8 shows a second exemplary embodiment of the invention according to FIG. 1.

Only those units of a device for coating substrates which are significant for explaining the invention are illustrated in the figures. A process chamber 1 is located in a reactor housing (not illustrated). The cover of said process chamber is formed by a gas inlet element, by way of which various process gases are introduced into the process chamber 1. In FIGS. 1 and 8, said gas inlet element is indicated by reference numeral 10. The gas inlet element 10 can be cooled or heated. It may have a large number of gas outlet openings which are disposed in the manner of a shower head and through which the process gases are introduced into the process chamber 1 either jointly or separately from one another.

The base of the process chamber 1 forms a bearing surface 4 for a large number of substrates 11 which are to be coated. In FIGS. 1 and 8, the substrates 1 are illustrated as being on the upper side of the susceptor 2, 3, which side faces the process chamber 1. However, the substrates can also be situated in depressions in the upper side which are adapted to the shape of the substrates. The bearing surface, which may be formed by the bases of the depressions (not illustrated), is the surface of the broad side of a susceptor upper part 2 which comprises graphite, said surface of the broad side facing the gas inlet element 10. The susceptor upper part 2 lies, by way of an annular seating surface, which is supported on a side wall portion 2″, on an end edge 3″ of a second susceptor part 3. The second susceptor part 3 forms a susceptor lower part and is likewise produced from graphite. The susceptor lower part 3 has a substantially annular or tubular configuration. An annular protrusion projects radially inward from the inner wall of the second susceptor part 3. Said annular protrusion not only forms the crosspieces designated by reference numeral 16 in FIG. 3, but also a seating surface 5 by way of which the susceptor lower part 3 is supported on an end face of a quartz tube which forms the susceptor carrier 6. The annular end face of the susceptor carrier 6 can have cut-outs into which the crosspieces 16 latch, so that the susceptor lower part 3 is connected to the susceptor carrier 6 in a rotationally fixed manner. The end edge portion of the susceptor carrier 6 projects into the hollow portion in the susceptor lower part 3, so that a positive connection is ensured between the susceptor rotary carrier 6 and the susceptor lower part. The susceptor carrier 6 can be driven in rotation, so that the susceptor 2, 3 can rotate with respect to the gas inlet element 10.

Figure 3:
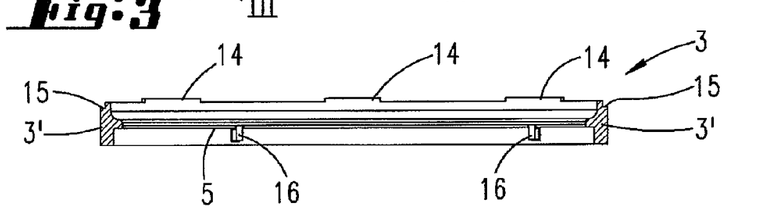
FIG. 3 shows a section according to the line in FIG. 2.
Figure 4:
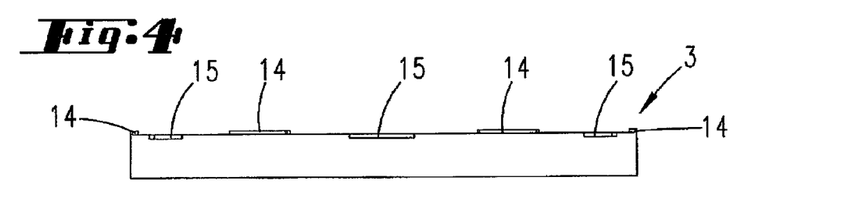
FIG. 4 shows a side view of the susceptor lower part.

As can be seen in FIGS. 3 and 4, protrusions 14 project upward from the end edge 3" on which the susceptor upper part 2 is supported. The upper end edge 3" also forms pockets 15 in a manner radially offset from the protrusions 14.

Pockets 18 in the susceptor upper part 2 correspond to the protrusions 14 which adjoin the inner wall of the susceptor lower part 3. The protrusions 14 engage in these pockets 18 when the susceptor upper part 2 rests on the susceptor lower part 3. As a result, the susceptor upper part 2 is connected to the susceptor lower part 3 in a positive manner.

The two susceptor parts 2, 3 together form a substantially cup-like body. A heater which comprises a plurality of resistance wire coils is located within the cup volume, adjacent to the base plate 2'. Various heating zones A, B, C are provided, these heating zones each being at different radial distances from the center of the susceptor 2, 3. The edge region of the susceptor upper part 2 is heated by the radially outermost heating zone C. In this case, the heating coils are at a lesser distance from one another than in the central region.

The susceptor upper part which is illustrated in FIGS. 1 and 5 to 7 has a flat bearing surface 4 for the substrates, this bearing surface being formed by the broad-side wall of the base plate 2'. In the region of the circular edge, said bearing surface 4 merges with a side wall portion 2" of the susceptor upper part 2 so as to form an outer rounded portion 7. The radius of the outer rounded portion 7 is approximately 15 mm. On its inner side, the susceptor upper part 2 likewise has an edge rounded portion 8 which is opposite the outer rounded portion 7. The radius of this inner rounded portion 8 is approximately 10 mm. The material thickness of the susceptor upper part 2 is less in the region of the side wall portion 2" than in the region of the base plate 2'.

The outer surface of the side wall 2" lines up flush with the outer wall 3' of the susceptor lower part.

In the second exemplary embodiment illustrated in FIG. 8, the susceptor lower part 3 forms a tubular sleeve. In this case too, the susceptor, which comprises two parts 2, 3, is rotationally symmetrical. The susceptor upper part 2 is in the form of a plate 2' in the form of a circular disc. The bearing surface for the substrates 4 runs in one plane throughout the central region. A sloping edge surface 12 is located in the region of the periphery of the plate 2'. This reduces the material thickness of the susceptor upper part 2 in the peripheral region.

Opposite from the sloping edge surface 12, the lower side of the base plate 2' forms a step 13 by way of which the susceptor upper part 2 rests on the peripheral end edge 3" of the susceptor lower part 3.

Figures 5, 6, 7:
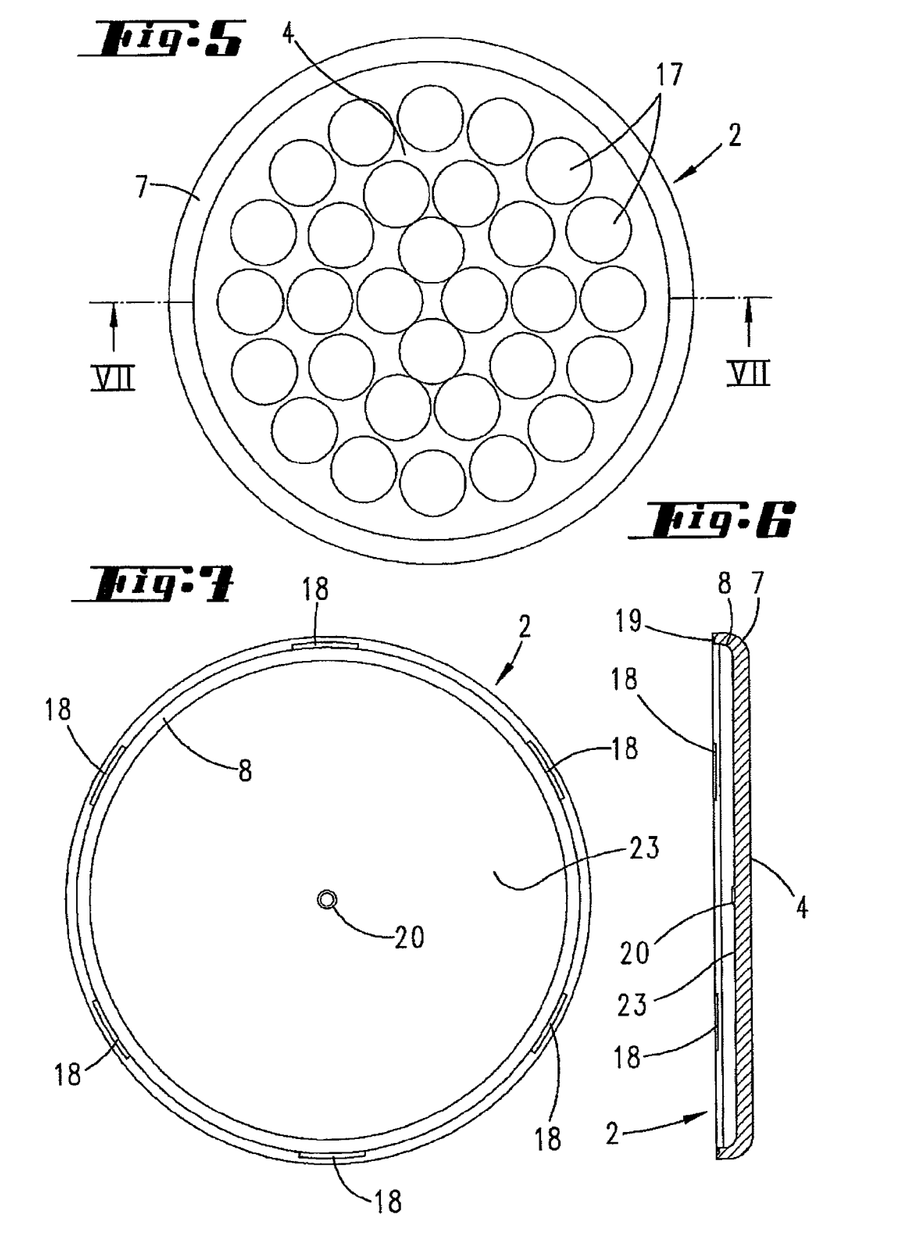
FIG. 5 shows a plan view of a susceptor upper part.
FIG. 6 shows a view of a susceptor upper part from below.
FIG. 7 shows a section according to the line VII-VII in FIG. 5.

The depressions which are illustrated in FIG. 5 and indicated by reference numeral 17 can be provided in this exemplary embodiment too, and a substrate 11 can be inserted into each depression.

A small gap of the order of magnitude of between 50 μm and 200 μm can be present between the end edge of the side wall portion 2" of the susceptor upper part 2 and the peripheral end edge 3" of the susceptor lower part 3. The susceptor upper part 2 may be supported on the susceptor lower part only locally, possibly with the interposition of an insulator. It suffices for the gap between the susceptor upper part 2 and the susceptor lower part 3 to be greater than 50 μm in order to prevent sufficient reduction in the flow of heat due to thermal conduction from the susceptor upper part 2 to the susceptor lower part 3. The closer arrangement of the heating elements 9 in the edge region of the susceptor upper part 2 to the rear of the outer curvature 8 serves to produce a homogeneous temperature profile, that is to say a flat lateral temperature gradient, on the upper surface. The heating elements 9 used are laid out such that their heating capacity and, in particular, radiation capacity in the edge region, that is to say in the heating zone C, is greater than in the center region, that is to say in zone A.

The temperature of the susceptor and, in particular, the temperature of the base plate 2' of the susceptor, as has been described in the above-described exemplary embodiments, can be measured using one or more thermocouples 24. A temperature measurement point is provided in the central region in particular. This is illustrated on an enlarged scale in FIG. 9. An annular bead 20 which projects from the surface 23 of the rear face of the base plate 2' of the susceptor upper part 2 defines a recess 21. The base 22 of the recess 21 runs level with the surface 23 of the rear face. The base of the recess 22 and the surface 23 of the rear face therefore run in the same plane.

Figure 9:
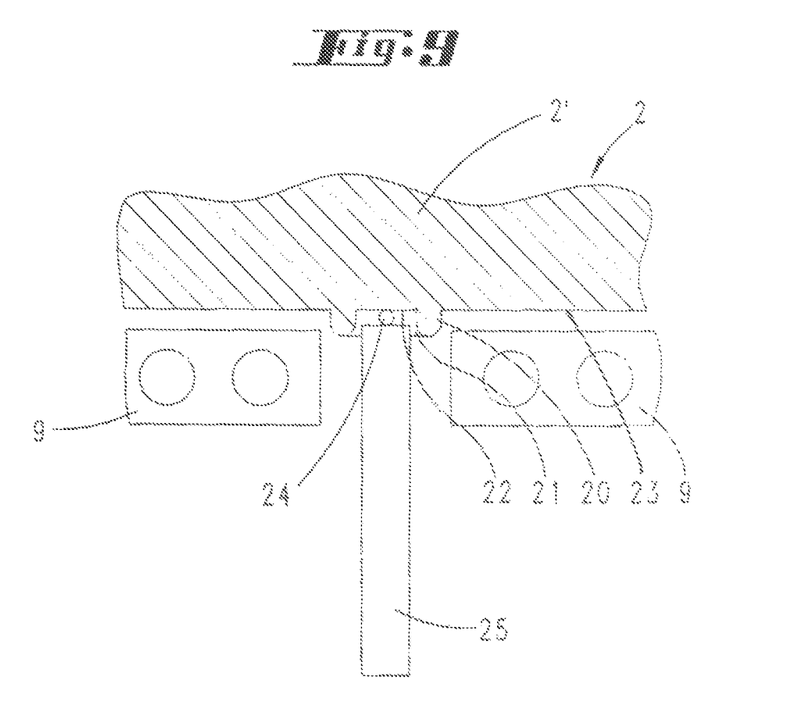
FIG. 9 shows an enlarged illustration of detail IX from FIG. 1.

The thermocouple 24 is carried by an, in particular ceramic, thermocouple holder 25. The thermocouple is located in front of the end surface of the thermocouple holder and is in physical contact with the recess base 22. The end portion of the thermocouple holder 25 which carries the thermocouple 24 projects out above the apex of the annular bead 20 into the recess 21.

On account of this configuration, the material thickness of the susceptor 2 in the region of the temperature measurement point is identical to the material thickness in the surrounding region, so that the measurement point does not exert any influence on the profile of the surface temperature of the bearing surface 4.

This arrangement of the thermocouple is also advantageous when the susceptor upper part 2 has to be removed from the reactor housing for cleaning purposes. In this case, the susceptor upper part 2 is slightly raised and in the process separated from the susceptor lower part 3. While the susceptor upper part 2 is being cleaned, this taking place outside the reactor housing, the susceptor lower part 3 remains in the process chamber. The susceptor upper part 2 to be cleaned can be replaced by a cleaned susceptor upper part which can be placed on the end edge 3" of the susceptor lower part 3. In the process, the upwardly projecting protrusions 14 of the end edge 3" latch into the associated pockets 18 in the susceptor upper part 2.

The height of the protrusions 14 substantially corresponds to the height of the annular bead 20.

All features disclosed are (in themselves) pertinent to the invention. The disclosure content of the associated/accompanying priority documents (copy of the prior application) is also hereby incorporated in full in the disclosure of the application, including for the purpose of incorporating features of these documents in claims of the present application.

The invention claimed is:

1. A device for coating substrates, having a process chamber (1) which is disposed in a reactor housing and a two-part, substantially cup-shaped susceptor (2, 3) which is disposed in said process chamber, an upper part (2) of the susceptor being formed by a flat plate (2'), and a lower part (3) of the susceptor being formed by an annular or tubular structure, the outer side (4) of the flat plate (2') of the susceptor upper part (2) facing upward toward the process chamber (1) and forming a bearing surface for at least one substrate, the susceptor upper part (2), by way of its edge, resting on an end edge (3") of the susceptor lower part (3), the susceptor lower part (3) being supported by a tubular susceptor carrier (6), and a heater (9) with heating zones (A, B, C) for heating the susceptor upper part (2) being disposed beneath the flat plate (2'), the device characterized in that the susceptor upper part (2) can be removed from the process chamber (1) separately from the susceptor lower part (3), and a joint (30) between the edge of the susceptor upper part (2) and the end edge (3") of the susceptor lower part (3) forms a barrier to a conduction of heat from the susceptor upper part (2) to the susceptor lower part (3), wherein the heater (9) is disposed within a cavity of the cup-shaped susceptor (2, 3), the cavity being adjacent to the flat plate (2').

2. A device according to claim 1, further characterized in that the susceptor upper and lower parts (2, 3) are made of graphite.

3. A device according to claim 1, further characterized in that the outer side (4) of the susceptor upper part (2), which outer side forms a base of the process chamber (1), merges with a side wall portion (2") of the susceptor upper part (2) so as to form a rounded portion (7) of the susceptor upper part (2).

4. A device according to claim 3, further characterized by an inner rounded portion (8) which is opposite from the outer rounded portion (7), a radius of curvature of the inner rounded portion (8) being less than a radius of curvature of the outer rounded portion (7).

5. A device according to claim 3, further characterized in that a wall thickness of the side wall portion (2") of the susceptor upper part (2) is less than a wall thickness of the flat plate (2').

6. A device according to claim 1, further characterized by the heating zones (A, B, C) disposed beneath the flat plate (2'), the flat plate being substantially circular in plan view, of the susceptor upper part (2) at various distances from a center of the flat plate (2'), and are in particular disposed concentrically with respect to the center.

7. A device according to claim 6, further characterized in that a radially outermost one of the heating zones (C) has a higher heating capacity than inner ones of the heating zones (A, B), and the heating zones (A, B, C) are formed by resistance wires (9) which are situated closer to one another in a region of an edge than in a central region.

8. A device according to claim 1, further characterized by an annular and sloping edge region (12) of the susceptor upper part (2).

9. A device according to claim 1, further characterized by a step (13) which is formed by an edge of a surface (23) of a rear side of the flat plate (2'), said step supporting the susceptor upper part (2) on the end edge (3") of the susceptor lower part (3).

10. A device according to claim 1, further characterized in that the joint (30) between the susceptor upper part (2) and the susceptor lower part (3) has a gap width of at least approximately 100 μm.

11. A device according to claim 1, further characterized in that the susceptor carrier (6) is rotationally driven, in order to drive the cup-shaped susceptor (2, 3) in rotation with respect to a stationary heater.

12. A device according to claim 1, further characterized in that at least one accommodating opening is a recess (21) which is defined by an annular bead (20) that protrudes from a surface (23) of a rear side of the flat plate (2'), a base (22) of said recess lying substantially in a plane formed by the surface (23) of the rear side of the flat plate (2').

13. A device according to claim 12, further characterized in that the recess (21) is disposed in a center of the susceptor upper part (2).

14. A device according to claim 13, further characterized in that a thermocouple holder (25), which holds a thermocouple (24) in front of an end surface of the thermocouple holder, projects into the recess (21) to beyond an outer edge of the annular bead (20).

15. A device according to claim 14, further characterized in that the thermocouple (24) is in contact with the base of the recess (21) or is at a short distance from the base of the recess (21).

* * * * *